United States Patent [19]

Wilson

[11] Patent Number: 4,521,699
[45] Date of Patent: Jun. 4, 1985

[54] HIGH-SPEED SCHOTTKY TTL GATE APPARATUS

[75] Inventor: Stanley Wilson, Cupertino, Calif.

[73] Assignee: Advanced Micro Devices, Inc., Sunnyvale, Calif.

[21] Appl. No.: 416,450

[22] Filed: Sep. 10, 1982

[51] Int. Cl.³ ............... H03K 19/013; H03K 19/088; H03K 19/092; H03K 17/04

[52] U.S. Cl. .................... 307/456; 307/454; 307/254; 307/299 A; 307/300

[58] Field of Search ............... 307/454, 466, 270, 455, 307/456, 457, 458, 315, 317 A, 300, 280, 254, 562, 563, 440, 473, 475, 299 A

[56] References Cited

U.S. PATENT DOCUMENTS

| | | | |
|---|---|---|---|
| 3,553,601 | 2/1969 | Glasser | 307/454 X |
| 3,958,136 | 5/1976 | Schroeder | 307/300 X |
| 3,971,961 | 7/1976 | Inami et al. | 307/315 X |
| 4,255,670 | 3/1981 | Griffith | 307/454 X |

FOREIGN PATENT DOCUMENTS

| | | | |
|---|---|---|---|
| 163918 | 12/1980 | Japan | 307/456 |
| 25831 | 3/1981 | Japan | 307/473 |

OTHER PUBLICATIONS

1975 National Product Catalog, "Interface Integrated Circuits", FIG. 16, p. 8-35.

Primary Examiner—Stanley D. Miller
Assistant Examiner—David R. Bertelson
Attorney, Agent, or Firm—Patrick T. King; J. Vincent Tortolano; Gary T. Aka

[57] ABSTRACT

A transistor logic gate device is provided with a transistor coupled between the output terminal and a node of the internal phase splitter subcircuit to speed up switching without requiring an increase in internal current.

2 Claims, 2 Drawing Figures

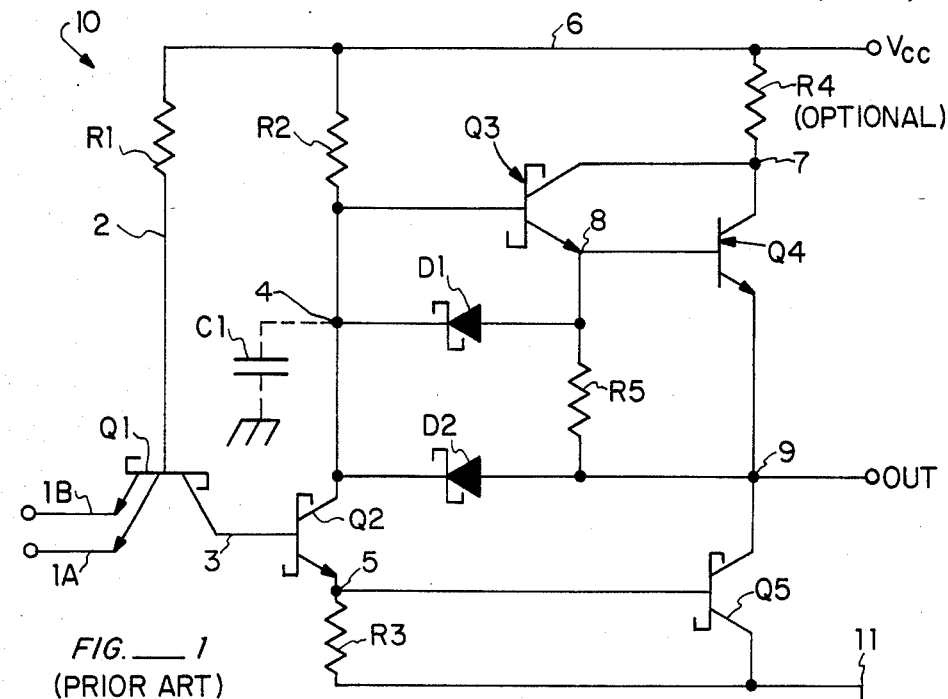
FIG.___1 (PRIOR ART)
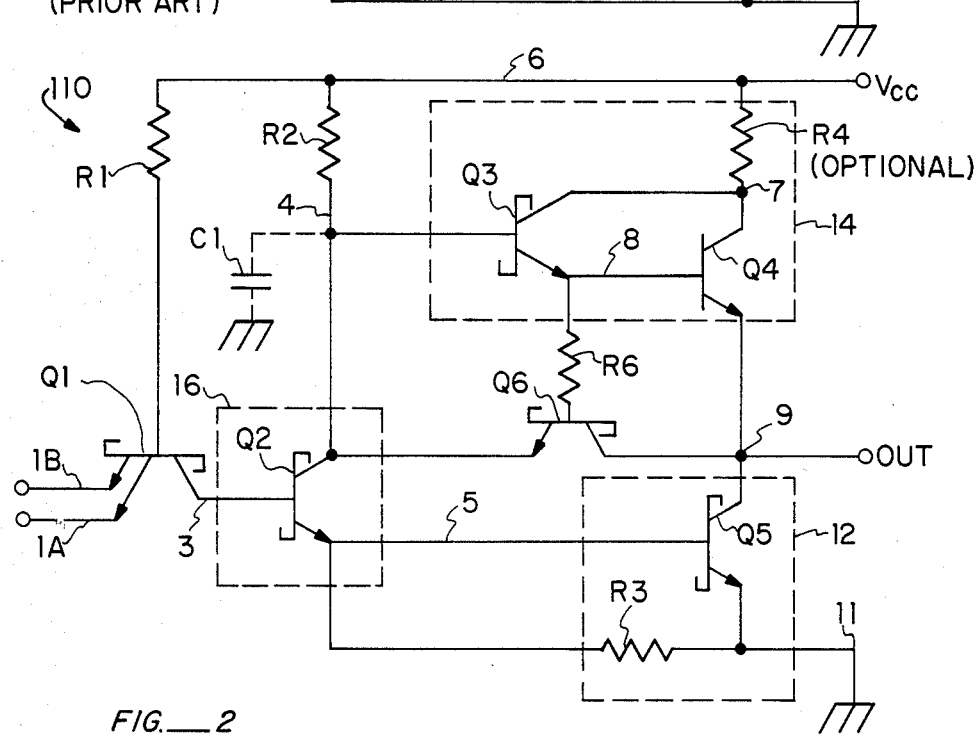
FIG.___2

HIGH-SPEED SCHOTTKY TTL GATE APPARATUS

FIELD OF INVENTION

This invention relates to transistor-transistor logic (TTL) circuit and in particular to a mechanism for accelerating switching of a TTL logic gate in integrated circuit form without increasing power dissipation.

BACKGROUND OF THE INVENTION AND DESCRIPTION OF THE PRIOR ART

In conventional TTL logic device, there is a propagation delay between the application of a binary signal to an input terminal and the result produced at an output terminal. The propagation delay is a result of the time required to change the direction or phase of current in the presence of stray capacitance in circuit elements and related components capable of storing charge. In high speed integrated circuits, such concerns are significant.

In the past, there have been a number of techniques for reducing propagation delays. One technique has been the amount of current used to steer the switching elements. Another technique has been to provide speed up diodes for discharging capacitance internal to the circuit device. Still another way has been to employ circuit elements which are inherently faster such as Schottky-type diodes and transistors which are inherently faster than conventional transistors.

Referring to FIG. 1, there is shown a prior art embodiment of a conventional high speed TTL logic gate 10. The gate 10 employs Schottky circuit elements for speed. All nodes and elements have been numbered for convenience of reference. Conventional circuit designations are employed to designate the elements.

A "pullup" subcircuit for providing current from a higher level voltage $V_{CC}$, which corresponds to a binary ONE (positive logic), comprises transistors Q3 and Q4 forming a Darlington coupled between node 7 and node 9, node 9 being the output terminal of the gate and node 7 being either an optional current limiting resistor R4 or a short circuit to node 6 coupled at the voltage source $V_{CC}$.

A subcircuit for "pull" of the output terminal node 9 to the ground node 11 comprises a transistor Q5 and resistor R3. A conventional squaring network (not shown) may optionally be substituted for the resistor R3.

A phase splitter subcircuit comprises a transistor Q2 which receives at its base a data signal input from a single or multiple emitter transistor Q1 through node 3 and which is operative to control the pullup and pulldown node 9.

In operation, when a binary ZERO or low level voltage appears at either input 1A or 1B, a low voltage appears at the base of Q2, namely at node 3, preventing transistor Q2 from conducting between its collector and emitter. The voltage at node 5 at the emitter therefore drops toward the ground level and the voltage at node 4 at the collector rises toward the $V_{CC}$ level. The high level appearing at the base of transistor Q3 permits transistor Q3 to begin to conduct to the base of transistor Q4, which in turn conducts current from $V_{CC}$ to the output at node 9. The voltage level at node 9 therefore moves toward the $V_{CC}$ level, generating a binary ONE.

When a binary ONE appears at both of the input terminals 1A and 1B, the output voltage goes to a binary ZERO according to the following mechanism.

With a binary ONE appearing at the input, transistor Q1 becomes non-conducting, and the voltage at the base of Q2 goes toward $V_{CC}$. The rise in the base-to-emitter voltage between node 3 and node 5 causes transistor Q2 to begin to conduct, sinking current from the base of transistor Q3 to turn off transistor Q3 and transistor Q4. Current from the high level voltage $V_{CC}$ is cut off from node 9, and transistor Q5 becomes conductive of current from node 9 to the ground 11 in order to dissipate whatever current load may be coupled to the output terminal at node 9.

The speed with which the transistor Q5 discharges the load drawing the output level at node 9 to the low level voltage toward ground depends on the base current delivered from node 5 to transistor Q5, which is dependent on the current characteristic of transistor Q5. Transistor Q5 and related resistor R3 must sink current not only from the load capacitance between the output node 9 and ground 11 but also any internal parasitic capacitances associated with the components in the structure of the device, represented here by capacitance element 12.

To speed up the discharge of the internal capacitances, speedup diodes D1 and D2 are provided, speedup diode D1 being coupled between node 8 and node 4 and speedup diode D2 being connected between node 9 and node 4 to be forward biased when nodes are at a voltage level higher than the voltage at node 4.

Speedup diode D1 is operative to discharge the base of transistor Q4 while speedup diode D2 is operative to divert some of the discharging load current at node 9 to the collector of transistor Q2. The resultant increased emitter current of transistor Q2 becomes the base drive current to pulldown transistor Q5. It is the purpose of this additional drive current routed through speedup diode D2 to sink current from the output node 9 even faster than would be normal in the absence of such speedup diodes as D1 and D2.

While speedup diodes enhance the switching speed of such high speed gates, the speedup diodes D1 and D2 increase the stray capacitance (capacitance element C1) of node 4 at least partly contributing to the proolem of undesired or stray capacitance which slows switching. Furthermore, by the inherent nature of silicon diodes, the speedup diodes D1 and D2 do not turn on until a forward bias of at least 0.7 volts has developed between node 8 or node 9 and node 4. Thus, until the voltage at node 4 has dropped considerably, the speedup diodes present a hindrance rather than a help to circuit operation speed. What is therefore needed is a mechanism for enhancing the switching speed of a high speed gate without the disadvantages of increased stray capacitance and a relatively high internal bias required of speedup circuitry.

SUMMARY OF THE INVENTION

According to the invention, in a high speed transistor-transistor logic gate having a pullup subcircuit means for enhancing the switching speed of outout stages including particularly the pulldown circuit, comprising a high speed switching transistor having a collector, a base and an emitter wherein the collector is coupled to a circuit output node, the emitter is coupled to the phase splitter circuit and the base is coupled to a current source in the pullup subcircuit for directing current from the pullup subcircuit to the phase transition subcircuit and to provide a current path between the output node and the phase transition subcircuit.

One of the advantages of the gate with a speedup transistor, particularly a Schottky-type transistor is the minimization of stray capacitance in the circuit.

Another advantage of a Schottky-type speedup transistor is that the speedup transistor requires only 0.2 volts of forward bias to achieve conduction.

Objects and further advantages of this invention will be apparent upon reference to the following detailed description taken in conjunction with the accompanying drawings.

BRIEF DESCRIPTION OF THE DRAWINGS

FIG. 1 is a schematic diagram of a conventional prior art TTL gate.

FIG. 2 is a schematic diagram illustrating a TTL gate according to the invention including a speedup transistor.

DESCRIPTION OF SPECIFIC EMBODIMENTS

In connection with FIG. 1, a typical prior art TTL gate 10 having speedup transistors has been described. FIG. 2 illustrates an improved gate 110 according to the invention. Identical numerals are employed in each figure to indicate identical or substantially identical circuit elements. A transistor Q5 and a resistor R3 form a pulldown subcircuit 12, transistor Q5 being a Schottky diode clamped transistor or simply a Schottky-type transistor. A pullup subcircuit 14 comprises Schottky-type transistor Q3, conventional output transistor Q4 and current-limiting resistor R4. A phase splitter subcircuit 16 includes Schottky-type transistor Q2 having its collector coupled at node 4 to the pullup subcircuit 14 and its emitter coupled to node 5 of the pulldown subcircuit 12. The base of transistor Q2 is coupled to an input transistor Q1.

According to the invention, a speedup transistor Q6, typically a Schottky-type transistor, is provided between the output node 9 coupled in common to the pulldown subcircuit 12 and the pullup subcircuit 14, an emitter coupled to node 4 of the phase splitter subcircuit 16, and a base coupled to a current-limiting resistor R6 to the base of output transistor Q4 at node 8.

A gate circuit 110 as illustrated in FIG. 2 is inherently faster than the conventional gate circuit 10 described in connection with FIG. 1, since by its nature, the speedup transistor Q6 minimizes additional stray capacitance at node 4 at the base of transistor Q3. Moreover, the circuit is inherently faster since the transistor Q6 requires only 0.2 volts of forward bias between collector and emitter to commence conduction to direct current from the output node 9 to the internal node 4. Minimization of the time constant at node 4 maximizes switching speed and signal propagation speed without the need for increased current. Resistor R2, which may be referred to as the phase splitter resistor of phase splitter subcircuit 16, is a power fixing resistor. Any reduction in the value of resistor R2 in an effort to reduce the time constant inherent at node 4 only increases current flow through the path from node 6 ($V_{CC}$) through transistor Q2 to node 5 and the pulldown subcircuit 12. Since the time constant controlling switching speed at node 4 is determined by the product of the equivalent resistance at node 4 including resistor R2, and the equivalent capacitance, typically the stray capacitance element C1, reduction in the stray capacitance element C1 minimizes the time constant and maximizes propagation speed. The speedup transistor Q6 does not materially increase the of stray capacitance elemenrs C1.

A resistor R6 is provided between the emitter of transistor Q3 and the base of speedup transistor Q6. Alternatively, resistor R6 may be coupled between the emitter of transistor Q3 and the collector of transistor Q5, thereby to provide a base-emitter current path for transistor Q4, since the emitter of transistor Q3 is coupled to the base of transistor Q4. The resistor R6 serves as a discharge resistor which in the circuit according to the invention is preferably connected to the base circuit of the speedup transistor Q6 instead of directly between node 8 and node 9 as in FIG. 1.

Current via transistor Q6 is provided from the output node 9 to the collector of transistor Q2 when the collector of transistor Q2 has fallen below the voltage $V_{OH}$ minus the $V_{CESAT}$ where $V_{OH}$ is the high binary output; $V_{CESAT}$ is the collector to emitter voltage at saturation across transistor Q6. Since the voltage drop across transistor Q6 at saturation is generally much smaller than the voltage drop across a forward biased diode, such as a speedup diode, the aiding current to node 4 can occur at an earlier stage and at a faster rate than is obtained by a conventional speedup diode configuration as in FIG. 1.

The speedup transistor Q6 need not by a Schottky transistor. A conventional transistor will also operate effectively but at a slower speed since the transistors generally saturate completely. The circuit according to the invention is also typically embodied in integrated circuit form where it is generally imperative to reduce capacitance, reduce defined current drain and enhance speed. A small change in a circuit parameter of this type is magnified many times in a large scale integrated circuit. Thus, each improvement, however minuscule, can prove to be a significant advance in the capability of the component.

The invention has now been explained with reference to specific embodiments. Other embodiments will be apparent to those of ordinary skill in the art. It is therefore not intended that this invention be limited except as indicated by the appended claims.

I claim:

1. A transistor logic circuit having an input terminal and an output terminal, including a phase splitter transistor, a pulldown circuit, and a pullup circuit; the phase splitter transistor having a base terminal coupled to the input terminal of the logic circuit, an emitter terminal coupled to a reference potential, and a collector terminal coupled to a source of potential, the pulldown circuit being coupled between the output terminal of the logic circuit and the reference potential, the pulldown circuit having an input connected to the emitter terminal of the phase splitter transistor; the pullup circuit including first and second transistor, each having emitter, base, and collector terminals and forming a Darlington output stage, the bse of the first transistor being connected to the collector terminal of the phase splitter transistor, the emitter terminal of the second transistor beig connected to the output terminal of the logic circuit, the emitter terminal of the first transistor being connected to the base terminal of the second transistor, the collector terminals of the first and second transistors being coupled to a source of potential, the improvement comprising: a transistor means for speeding up the switching characteristics of said logic circuit, said transistor means having a collector terminal coupled to said output terminal, an emitter terminal coupled to the collector terminal of said phase splitter transistor, and a base terminal coupled to base terminal of the second transistor of said pullup circuit.

2. The apparatus according to claim 1 further including a current limiting resistor and wherein said base terminal of said speedup tranistor means is coupled through said current limiting resistor to said base terminal of said second transistor of said pullup circuit.

* * * * *